(12) United States Patent
Smathers et al.

(10) Patent No.: US 10,510,470 B2
(45) Date of Patent: *Dec. 17, 2019

(54) DIFFUSION BARRIERS FOR METALLIC SUPERCONDUCTING WIRES

(71) Applicants: David Smathers, Columbus, OH (US); Paul Aimone, Bridgewater, MA (US)

(72) Inventors: David Smathers, Columbus, OH (US); Paul Aimone, Bridgewater, MA (US)

(73) Assignee: H.C. STARCK INC., Newton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/964,723

(22) Filed: Apr. 27, 2018

(65) Prior Publication Data
US 2018/0315523 A1 Nov. 1, 2018

Related U.S. Application Data

(63) Continuation of application No. 15/696,330, filed on Sep. 6, 2017, now Pat. No. 9,984,795.

(60) Provisional application No. 62/383,676, filed on Sep. 6, 2016.

(51) Int. Cl.
| | | |
|---|---|---|
| *H01B 12/10* | (2006.01) | |
| *H01B 12/06* | (2006.01) | |
| *H01L 39/12* | (2006.01) | |
| *H01L 39/14* | (2006.01) | |
| *H01L 39/24* | (2006.01) | |

(52) U.S. Cl.
CPC .............. *H01B 12/10* (2013.01); *H01B 12/06* (2013.01); *H01L 39/12* (2013.01); *H01L 39/14* (2013.01); *H01L 39/2403* (2013.01); *H01L 39/2406* (2013.01); *H01L 39/2409* (2013.01); *Y02E 40/642* (2013.01); *Y02E 40/644* (2013.01)

(58) Field of Classification Search
CPC .............................. H01L 39/2406; H01B 12/10
USPC ................................ 174/125.1; 505/231, 431
See application file for complete search history.

(56) References Cited

U.S. PATENT DOCUMENTS

| | | | |
|---|---|---|---|
| 3,592,639 A | 7/1971 | Schussler et al. | |
| 4,205,119 A | 5/1980 | Young et al. | |
| 4,501,062 A * | 2/1985 | Hillmann | H01L 39/2409 174/125.1 |
| 2003/0045433 A1 | 3/2003 | Iwaki | |
| 2003/0207765 A1 * | 11/2003 | Bower | H01L 39/141 505/100 |
| 2005/0178472 A1 | 8/2005 | Hong et al. | |
| 2006/0081307 A1 | 4/2006 | Field et al. | |
| 2007/0186998 A1 | 8/2007 | Kato et al. | |
| 2007/0238620 A1 | 10/2007 | Flukiger et al. | |

(Continued)

FOREIGN PATENT DOCUMENTS

KR   10-2014-0015189 A   2/2014

OTHER PUBLICATIONS

International Search Report and the Written Opinion for International Application No. PCT/US2017/050163 dated Jan. 15, 2018 12 pages.

*Primary Examiner* — Sherman Ng
(74) *Attorney, Agent, or Firm* — Morgan, Lewis & Bockius LLP

(57) ABSTRACT

In various embodiments, superconducting wires incorporate diffusion barriers composed of Ta alloys that resist internal diffusion and provide superior mechanical strength to the wires.

24 Claims, 7 Drawing Sheets

(56) References Cited

U.S. PATENT DOCUMENTS

| | | | |
|---|---|---|---|
| 2008/0287303 A1* | 11/2008 | Kato | H01L 39/14 |
| | | | 505/231 |
| 2009/0005251 A1 | 1/2009 | Flukiger et al. | |
| 2009/0176650 A1 | 7/2009 | Miyatake et al. | |
| 2009/0305897 A1 | 12/2009 | Grasso et al. | |
| 2010/0093546 A1* | 4/2010 | Schlenga | H01L 39/141 |
| | | | 505/231 |
| 2011/0190139 A1* | 8/2011 | Ohata | H01B 12/04 |
| | | | 505/230 |
| 2012/0108437 A1* | 5/2012 | Ohata | H01L 39/2409 |
| | | | 505/231 |
| 2013/0053250 A1* | 2/2013 | Ohata | H01L 39/2409 |
| | | | 505/231 |
| 2014/0096997 A1* | 4/2014 | Schlenga | H01L 39/12 |
| | | | 174/125.1 |
| 2014/0155270 A1 | 6/2014 | Szulczyk | |
| 2015/0024943 A1 | 1/2015 | Sugimoto et al. | |
| 2015/0348679 A1 | 12/2015 | Takeuchi et al. | |
| 2017/0309375 A1 | 10/2017 | Aimone et al. | |

* cited by examiner

DIFFUSION BARRIERS FOR METALLIC SUPERCONDUCTING WIRES

RELATED APPLICATIONS

This application is a continuation of U.S. patent application Ser. No. 15/696,330, filed Sep. 6, 2017, which claims the benefit of and priority to U.S. Provisional Patent Application No. 62/383,676, filed Sep. 6, 2016, the entire disclosure of each of which is hereby incorporated herein by reference.

TECHNICAL FIELD

In various embodiments, the present invention relates to the formation and processing of superconducting wires that incorporate diffusion barriers for prevention of low-conductivity phases.

BACKGROUND

A superconducting material exhibits no electrical resistance when cooled below its characteristic critical temperature. Although high-temperature superconductor materials, which have critical temperatures higher than the 77K boiling point of nitrogen, have been identified, these materials are often exotic (e.g., perovskite ceramics), difficult to process, and unsuitable for high-field applications. Thus, for practical superconducting applications requiring wires and coils and bundles thereof, the metallic superconductors Nb—Ti and $Nb_3Sn$ are most often utilized. While these materials have critical temperatures below 77K, the relative ease of processing these materials (e.g., drawing into wires), as well as their ability to operate at high currents and high magnetic fields, have resulted in their widespread use.

Typical metallic superconducting wires feature multiple strands (or "filaments") of the superconducting phase embedded within a copper (Cu) conductive matrix. While Nb—Ti is sufficiently ductile to be drawn down into thin wires directly, its applicability is typically limited to applications featuring magnetic fields having strengths below approximately 8 Tesla. $Nb_3Sn$ is a brittle intermetallic phase that cannot withstand wire-drawing deformation, and thus it is typically formed after wire drawing via diffusion heat treatment. $Nb_3Sn$ superconducting materials may typically be used in applications featuring magnetic fields having strengths up to at least 20 Tesla. Thus, several different techniques have been utilized to fabricate $Nb_3Sn$-based superconducting wires. For example, in the "bronze process," a large composite is fabricated from Nb rods and Cu—Sn alloy rods (that include, e.g., 13-15% Sn) surrounding the Nb rods. Since these materials are ductile, the composite may be drawn down to a suitable diameter, and then the drawn-down composite is annealed. The heat treatment results in interdiffusion and the formation of the $Nb_3Sn$ phase at the interface between the Nb and the Cu—Sn. Other processes for forming $Nb_3Sn$-based superconducting wires similarly involve formation of the brittle $Nb_3Sn$ phase after wire drawing. For example, pure Sn or Sn alloys with Cu or Mg may be incorporated in the interior of the initial composite and annealed after drawing. Alternatively, Nb filaments may be embedded within a Cu matrix and drawn down into wire. The resulting wire may subsequently be coated with Sn. The coated wire is heated, forming a Sn—Cu phase that eventually reacts with the Nb filaments to form the $Nb_3Sn$ phase.

While the techniques detailed above have resulted in the successful fabrication of metallic superconducting wires utilized for a host of different applications, the resulting wires often exhibit insufficient electrical performance. Typical superconducting wires contain many of the $Nb_3Sn$ or Nb—Ti filaments described above embedded within, disposed around, and/or surrounded by a Cu stabilizer that provides the wires with sufficient ductility for handling and incorporation within industrial systems. Although this Cu stabilizer is not itself superconducting, the high electrical conductivity of Cu can enable satisfactory overall electrical performance of the wire. Unfortunately, various elements from the superconducting filaments (e.g., Sn) may react with portions of the Cu stabilizer, forming low-conductivity phases that negatively impact the overall conductivity of the entire wire. While diffusion barriers have been utilized to shield the Cu stabilizer from the superconducting filaments, these barriers tend to have non-uniform cross-sectional areas and may even locally rupture due to non-uniform deformation during co-processing of the diffusion barrier and the Cu stabilizer. While such diffusion barriers could simply be made thicker, such solutions impact the overall conductivity of the wire due to the lower electrical conductivity of the diffusion barrier material itself. For example, for cutting-edge and future applications such as new particle accelerators and colliders, magnets are being designed beyond existing wire capabilities; such wires will require a non-copper critical current density of more than 2000 $A/mm^2$ at 15 Tesla. As the diffusion barrier is part of the non-copper fraction, minimizing the volume of any barrier material is important while any strength benefit is advantageous.

In view of the foregoing, there is a need for improved diffusion barriers for metallic superconducting wires that substantially prevent deleterious reactions involving the Cu stabilizer while remaining uniformly thin so as not to occupy a significant amount of the overall cross-sectional area of the wire.

SUMMARY

In accordance with various embodiments of the present invention, a superconducting wire and/or precursor thereof (e.g., a composite filament utilized to form the wire) features a diffusion barrier including, consisting essentially of, or consisting of a tantalum (Ta) alloy. The diffusion barrier is typically disposed between at least a portion of the Cu wire matrix and the superconducting filaments, and/or between the superconducting filaments and a stabilizing element incorporated within and/or around the superconducting wire for additional mechanical strength. In accordance with embodiments of the invention, monofilaments may each include, consist essentially of, or consist of a Nb-based core within a Cu-based (e.g., Cu or bronze (Cu—Sn)) matrix, and stacked assemblies of the monofilaments may be disposed within a Cu-based matrix and drawn down to form composite filaments. Thus, composite filaments may each include, consist essentially of, or consist of multiple Nb-based monofilaments within a Cu-based matrix. A diffusion barrier in accordance with embodiments of the invention may be disposed around each composite filament when the composite filaments are stacked to form the final wire, and/or a diffusion barrier may be disposed around the stack of composite filaments and between the stack of composite filaments and an outer Cu stabilizer or matrix.

In various embodiments, composite filaments are disposed within a Cu-based matrix (e.g., a Cu-based tube) and drawn down into the superconducting wire (or precursor thereof) and heat treated. One or more of the composite filaments may themselves incorporate a diffusion barrier therein, and/or a diffusion barrier may be disposed within the Cu-based matrix of the superconducting wire and around the composite filaments. In various embodiments, the diffusion barrier includes, consists essentially of, or consists of a Ta—W alloy including, e.g., 0.2% to 10% W or 0.2% to 5% W. For example, the diffusion barrier may include, consist essentially of, or consist of an alloy of Ta and approximately 2.5%-3% W (i.e., Ta-3W). In various embodiments, the diffusion barrier includes, consists essentially of, or consists of a Ta—W alloy (e.g., Ta-3W) with one or more additional alloying elements therein, e.g., alloying elements such as Ru, Pt, Pd, Rh, Os, Ir, Mo, Re, and/or Si. Such alloying elements may be present in the diffusion barrier individually or collectively at concentrations up to 5% by weight (e.g., between 0.05% and 5%, between 0.1% and 3%, between 0.2% and 2%, between 0.2% and 1%, or between 0.2% and 0.5%). In various embodiments of the invention, welds formed of Ta—W alloys incorporating one or more of these additional alloying elements may have grain structures that are more equiaxed toward the center of such welds; thus, welded tubes formed of these materials for use as diffusion barriers may exhibit superior mechanical properties and processability when drawn down to small sizes during wire fabrication.

Ta-alloy diffusion barriers in accordance with embodiments of the invention may also exhibit advantageous ductility due at least in part to low oxygen contents and/or high levels of purity. For example, diffusion barriers in accordance with embodiments of the invention have oxygen contents less than 500 ppm, less than 200 ppm, less than 100 ppm, or even less than 50 ppm. In addition or alternatively, diffusion barriers in accordance with embodiments of the invention may have purities exceeding 99.9%, or even exceeding 99.99%.

Advantageously, Ta-alloy diffusion barriers in accordance with embodiments of the invention have refined grain structures (e.g., small average grain sizes) when compared to conventional diffusion barrier materials, and this enables the deformation and processing of the diffusion barriers within the superconducting wire to be substantially uniform without localized thinning that can rupture the diffusion barrier and compromise the performance of the wire. The small grain size of the diffusion barriers (e.g., less than 20 μm, less than 10 μm, less than 5 μm, between 1 and 20 μm, or between 5 and 15 μm) results from the presence of the alloying element(s), and thus diffusion barriers in accordance with embodiments of the invention need no additional processing (e.g., forging such as tri-axial forging, heat treatments, etc.) to produce the refined grain structure. Thus, overall manufacturing costs and complexity may be reduced via use of diffusion barriers in accordance with the present invention.

The superior grain structure and/or mechanical properties of diffusion barriers in accordance with embodiments of the present invention enable the diffusion barriers to provide protection from deleterious diffusion within the semiconductor wire without occupying excessive amounts of the cross-sectional (i.e., current-carrying) area of the wire. (In contrast, the use of various other diffusion barriers with lesser mechanical properties and/or less refined grain structures would require the use of larger barriers that would deleteriously impact the ductility, conductivity, and/or various other properties of the final wire.) Wires in accordance with embodiments of the present invention exhibit little or no interdiffusion with the Cu matrix while retaining good high-field, high-current superconducting properties below their critical temperatures.

The use of Ta-alloy diffusion barriers advantageously enables less of the cross-section of the superconducting wire to be occupied by the diffusion barrier, and thus more of the cross-section may be occupied by current-carrying superconducting filaments. However, diffusion-barrier materials in accordance with embodiments of the invention also advantageously provide additional mechanical strength to the superconducting wire while retaining good high-field, high-current superconducting properties below their critical temperatures. In various embodiments, the mechanical strength of wires may facilitate mechanical deformation of the wire (e.g., winding, coiling, etc.) without compromising the electrical performance of the wire and/or without causing cracks or fractures in, or otherwise compromising the mechanical stability of, the wire and/or its filaments. In various embodiments, the diffusion barrier(s) may collectively occupy at least 2%, at least 3%, at least 4%, or at least 5% of the cross-sectional area of the final wire. In various embodiments, the diffusion barrier(s) may collectively occupy less than 15%, less than 12%, less than 10%, less than 9%, or less than 8% of the cross-sectional area of the final wire. In this manner, the diffusion barrier(s) within the superconducting wire provide, in accordance with various embodiments, the wire with a minimum yield strength (e.g., after any heat treatment of the wire and/or of the filaments) of at least 75 MPa, or even at least 100 MPa.

The enhanced mechanical strength of superconducting wires in accordance with embodiments of the invention advantageously enables such wires to withstand Lorentz forces exerted on the wire during operation at high magnetic field strengths. As known in the art, the "self-field" in a magnet winding is higher than the center-line field and is highest at the innermost winding. In addition, the current required to create the field is the same in all the wire in the magnet. The Lorentz force is F=B×I (i.e., magnetic field crossed into current), and the generated field is directly proportional to the current I; thus, the force is proportional to the square of the current. For example, the Lorentz forces will be four times higher at 16 Tesla compared to 8 Tesla. Thus, as the applied magnetic field is increased in magnitude, the mechanical strength of the wire to withstand the force (perpendicular to both current and field, via the cross-product relation) must be higher as well. Superconducting wires in accordance with embodiments of the invention may be advantageously deployed for applications utilizing magnetic fields having strengths of at least 2 Tesla, at least 5 Tesla, at least 8 Tesla, or even at least 10 Tesla, i.e., magnetic flux densities of at least 20,000 gauss, at least 50,000 gauss, at least 80,000 gauss, or even at least 100,000 gauss.

Embodiments of the present invention may also incorporate stabilizing elements within the wires themselves and/or within the composite filaments utilized to form the wire. For example, embodiments of the invention may incorporate stabilizing elements that include, consist essentially of, or consist of Ta, a Ta alloy (e.g., an alloy of Ta and W such as Ta-3W), or an alloy of Nb with one or more of Hf, Ti, Zr, Ta, V, Y, Mo, or W, as described in U.S. patent application Ser. No. 15/205,804, filed on Jul. 8, 2016 ("the '804 application"), the entire disclosure of which is incorporated by reference herein.

In an aspect, embodiments of the invention feature a superconducting wire that includes, consists essentially of, or consists of an outer wire matrix, a diffusion barrier disposed within the wire matrix, and a plurality of composite filaments surrounded by the diffusion barrier and separated from the outer wire matrix by the diffusion barrier. The outer wire matrix includes, consists essentially of, or consists of Cu. The diffusion barrier includes, consists essentially of, or consists of a Ta—W alloy (e.g., a Ta alloy containing 0.2%-10% W). One or more, or even each, of the composite filaments includes, consists essentially of, or consists of (i) a plurality of monofilaments and (ii) a cladding surrounding the plurality of monofilaments. The composite-filament cladding may include, consist essentially of, or consist of Cu. One or more, or even each, of the monofilaments includes, consists essentially of, or consists of a core and a cladding surrounding the core. The monofilament core may include, consist essentially of, or consist of Nb. The monofilament cladding may include, consist essentially of, or consist of Cu. The diffusion barrier extends through an axial dimension of the superconducting wire.

Embodiments of the invention may include one or more of the following in any of a variety of combinations. The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of $Nb_3Sn$. The diffusion barrier may include, consist essentially of, or consist of Ta-3W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire).

The wire may include a stabilizing element disposed within the plurality of composite filaments and surrounded by the diffusion barrier. The stabilizing element may include, consist essentially of, or consist of a Ta alloy containing 0.2%-10% W. At least a portion of the stabilizing element may be located substantially at the central core of the superconducting wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In another aspect, embodiments of the invention feature a superconducting wire that includes, consists essentially of, or consists of a wire matrix and a plurality of composite filaments embedded within the wire matrix. The wire matrix includes, consists essentially of, or consists of Cu. One or more, or even each, of the composite filaments includes, consists essentially of, or consists of (i) a plurality of monofilaments, (ii) a diffusion barrier extending through an axial dimension of the composite filament and surrounding the plurality of monofilaments, and (iii) a cladding surrounding the diffusion barrier, the diffusion barrier separating the cladding from the plurality of monofilaments. The composite-filament diffusion barrier includes, consists essentially of, or consists of a Ta—W alloy (e.g., a Ta alloy containing 0.2%-10% W). The composite-filament cladding includes, consists essentially of, or consists of Cu. One or more, or even each, of the monofilaments includes, consists essentially of, or consists of a core and a cladding surrounding the core. The monofilament core may include, consist essentially of, or consist of Nb. The monofilament cladding may include, consist essentially of, or consist of Cu.

Embodiments of the invention may include one or more of the following in any of a variety of combinations. The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of $Nb_3Sn$. The diffusion barrier may include, consist essentially of, or consist of Ta-3W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire).

The wire may include a stabilizing element disposed within the plurality of composite filaments. The stabilizing element may include, consist essentially of, or consist of a Ta alloy containing 0.2%-10% W. At least a portion of the stabilizing element may be located substantially at the central core of the superconducting wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In yet another aspect, embodiments of the invention feature a superconducting wire that includes, consists essentially of, or consists of an inner wire stabilizing matrix, a diffusion barrier disposed around the wire stabilizing matrix, and a plurality of composite filaments disposed around the diffusion barrier and separated from the wire stabilizing matrix by the diffusion barrier. The wire stabilizing matrix includes, consists essentially of, or consists of Cu. The diffusion barrier includes, consists essentially of, or consists of a Ta—W alloy (e.g., a Ta alloy containing 0.2%-10% W). One or more, or even each, of the composite filaments includes, consists essentially of, or consists of (i) a plurality of monofilaments, and (ii) (iii) a cladding surrounding the plurality of monofilaments. The composite-filament cladding includes, consists essentially of, or consists of Cu. The diffusion barrier extends through an axial dimension of the wire.

Embodiments of the invention may include one or more of the following in any of a variety of combinations. The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of Nb$_3$Sn. The diffusion barrier may include, consist essentially of, or consist of Ta-3W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire).

The wire may include a stabilizing element disposed within the plurality of composite filaments or within or proximate the inner wire stabilizing matrix. The stabilizing element may include, consist essentially of, or consist of a Ta alloy containing 0.2%-10% W. At least a portion of the stabilizing element may be located substantially at the central core of the superconducting wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In another aspect, embodiments of the invention feature a superconducting wire possessing diffusion resistance and mechanical strength. The superconducting wire includes, consists essentially of, or consists of an outer wire matrix, a diffusion barrier disposed within the wire matrix, and a plurality of composite filaments surrounded by the diffusion barrier and separated from the outer wire matrix by the diffusion barrier. The outer wire matrix includes, consists essentially of, or consists of Cu. The diffusion barrier includes, consists essentially of, or consists of a Ta—W alloy (e.g., a Ta alloy containing 0.2%-10% W). One or more, or even each, of the composite filaments includes, consists essentially of, or consists of (i) a plurality of monofilaments and (ii) a cladding surrounding the plurality of monofilaments. The composite-filament cladding may include, consist essentially of, or consist of Cu. One or more, or even each, of the monofilaments includes, consists essentially of, or consists of a core and a cladding surrounding the core. The monofilament core may include, consist essentially of, or consist of Nb. The monofilament cladding may include, consist essentially of, or consist of Cu. The diffusion barrier extends through an axial dimension of the superconducting wire. The diffusion barrier occupies 1%-20%, 2%-15%, or 3%-10% of the cross-sectional area of the superconducting wire.

Embodiments of the invention may include one or more of the following in any of a variety of combinations. The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of Nb$_3$Sn. The diffusion barrier may include, consist essentially of, or consist of Ta-3W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire). The yield strength of the superconducting wire may be at least 75 MPa, or even at least 100 MPa.

The wire may include a stabilizing element disposed within the plurality of composite filaments and surrounded by the diffusion barrier. The stabilizing element may include, consist essentially of, or consist of a Ta alloy containing 0.2%-10% W. At least a portion of the stabilizing element may be located substantially at the central core of the superconducting wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In another aspect, embodiments of the invention feature a superconducting wire possessing diffusion resistance and mechanical strength. The superconducting wire includes, consists essentially of, or consists of a wire matrix and a plurality of composite filaments embedded within the wire matrix. The wire matrix includes, consists essentially of, or consists of Cu. One or more, or even each, of the composite filaments includes, consists essentially of, or consists of (i) a plurality of monofilaments, (ii) a diffusion barrier extending through an axial dimension of the composite filament and surrounding the plurality of monofilaments, and (iii) a cladding surrounding the diffusion barrier, the diffusion barrier separating the cladding from the plurality of monofilaments. The composite-filament diffusion barrier includes, consists essentially of, or consists of a Ta—W alloy (e.g., a Ta alloy containing 0.2%-10% W). The composite-filament cladding includes, consists essentially of, or consists of Cu. One or more, or even each, of the monofilaments includes, consists essentially of, or consists of a core and a cladding surrounding the core. The monofilament core may include, consist essentially of, or consist of Nb. The monofilament cladding may include, consist essentially of, or consist of Cu. The diffusion barriers collectively occupy 1%-20%, 2%-15%, or 3%-10% of the cross-sectional area of the superconducting wire.

Embodiments of the invention may include one or more of the following in any of a variety of combinations. The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of Nb$_3$Sn. The diffusion barrier may include, consist essentially of, or consist of Ta-3W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire). The yield strength of the superconducting wire may be at least 75 MPa, or even at least 100 MPa.

The wire may include a stabilizing element disposed within the plurality of composite filaments. The stabilizing element may include, consist essentially of, or consist of a Ta alloy containing 0.2%-10% W. At least a portion of the stabilizing element may be located substantially at the central core of the superconducting wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

In yet another aspect, embodiments of the invention feature a superconducting wire possessing diffusion resistance and mechanical strength. The superconducting wire includes, consists essentially of, or consists of an inner wire stabilizing matrix, a diffusion barrier disposed around the wire stabilizing matrix, and a plurality of composite filaments disposed around the diffusion barrier and separated from the wire stabilizing matrix by the diffusion barrier. The wire stabilizing matrix includes, consists essentially of, or consists of Cu. The diffusion barrier includes, consists essentially of, or consists of a Ta—W alloy (e.g., a Ta alloy containing 0.2%-10% W). One or more, or even each, of the composite filaments includes, consists essentially of, or consists of (i) a plurality of monofilaments, and (ii) (iii) a cladding surrounding the plurality of monofilaments. The composite-filament cladding includes, consists essentially of, or consists of Cu. The diffusion barrier extends through an axial dimension of the wire. The diffusion barrier occupies 1%-20%, 2%-15%, or 3%-10% of the cross-sectional area of the superconducting wire.

Embodiments of the invention may include one or more of the following in any of a variety of combinations. The core of one or more, or even each, of the monofilaments may include, consist essentially of, or consist of an alloy, pseudo-alloy, or mixture containing Nb and one or more of Ti, Zr, Hf, Ta, Y, or La (e.g., Nb—Ti). The core of one or more, or even each, of the monofilaments may include, consist essentially of, or consist of $Nb_3Sn$. The diffusion barrier may include, consist essentially of, or consist of Ta-3W. The diffusion barrier may additionally contain one or more alloying elements selected from the group consisting of Ru, Pt, Pd, Rh, Os, Ir, Mo, Re, or Si. The cross-sectional thickness and/or cross-sectional area of the diffusion barrier may be substantially constant along the thickness of the wire. One or more, or even each, of the composite filaments may have a hexagonal cross-sectional shape (i.e., in cross-section perpendicular to the axial dimension of the wire). One or more, or even each, of the monofilaments may have a hexagonal cross-sectional shape (i.e., in cross-section perpendicular to the axial dimension of the wire). The yield strength of the superconducting wire may be at least 75 MPa, or even at least 100 MPa.

The wire may include a stabilizing element disposed within the plurality of composite filaments or within or proximate the inner wire stabilizing matrix. The stabilizing element may include, consist essentially of, or consist of a Ta alloy containing 0.2%-10% W. At least a portion of the stabilizing element may be located substantially at the central core of the superconducting wire. The stabilizing element may occupy less than approximately 20% of a cross-section of the wire, less than approximately 10% of a cross-section of the wire, or less than approximately 5% of a cross-section of the wire. The stabilizing element may occupy more than approximately 1% of a cross-section of the wire, more than approximately 2% of a cross-section of the wire, more than approximately 5% of a cross-section of the wire, more than approximately 8% of a cross-section of the wire, or more than approximately 10% of a cross-section of the wire.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately" and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure consisting essentially of multiple metals will generally include only those metals and only unintentional impurities (which may be metallic or non-metallic) that may be detectable via chemical analysis but do not contribute to function. As used herein, "consisting essentially of at least one metal" refers to a metal or a mixture of two or more metals but not compounds between a metal and a non-metallic element or chemical species such as oxygen, silicon, or nitrogen (e.g., metal nitrides, metal silicides, or metal oxides); such non-metallic elements or chemical species may be present, collectively or individually, in trace amounts, e.g., as impurities.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
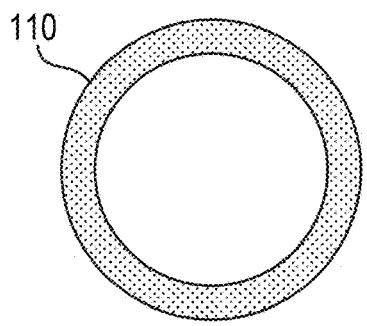
FIG. 1A is a schematic cross-sectional view of a tube utilized to form a monofilament in accordance with various embodiments of the invention.
Figure 1B:
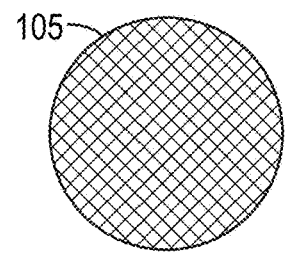
FIG. 1B is a schematic cross-sectional view of a rod utilized to form a monofilament in accordance with various embodiments of the invention.
Figure 1C:
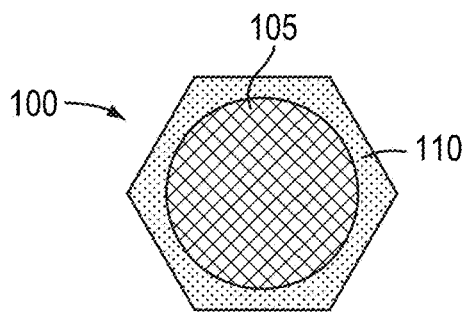
FIG. 1C is a schematic cross-sectional view of a monofilament utilized to form a composite filament in accordance with various embodiments of the invention.

FIGS. 1A-1C depict components of an exemplary monofilament 100 and constituent components thereof. In accordance with embodiments of the invention, a rod 105 is disposed within a tube 110 that includes, consists essentially of, or consists of Cu or a Cu alloy (e.g., bronze). The composition of the rod 105 may be selected based on the particular metallic superconductor desired in the final wire. For example, the rod 105 may include, consist essentially of, or consist of Nb, Ti, Nb—Ti, or an alloy thereof. In other examples, the rod 105 may include, consist essentially of, or consist of Nb alloyed with one or more of Ti, Zr, Hf, Ta, Y, or La. Such alloying elements may be individually or collectively present within the rod 105 (and thus within the core of a monofilament 100) is concentrations of, for example, 0.2%-10% (e.g., 0.2%-5%, or 0.5%-1%). The rod 105 clad with the tube 110 may subsequently be drawn down to reduce its diameter to, for example, between 0.5 inch and 1.5 inches. The clad rod may be drawn down in multiple stages and may be heat treated during and/or after any or each of the drawing steps for, e.g., strain relief. Once drawn down, the clad rod may be drawn through a shaped die in order to fabricate the monofilament 100 shaped for efficient stacking with other monofilaments. For example, as shown in FIG. 1C, a hexagonal die may be utilized to form a monofilament 100 having a hexagonal cross-section. In other embodiments, monofilaments may have other cross-sections, e.g., square, rectangular, triangular, etc.

Figure 2A:
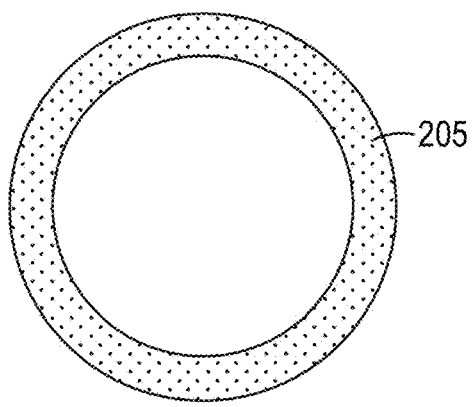
FIG. 2A is a schematic cross-sectional view of a tube utilized to form a composite filament in accordance with various embodiments of the invention.
Figure 2B:
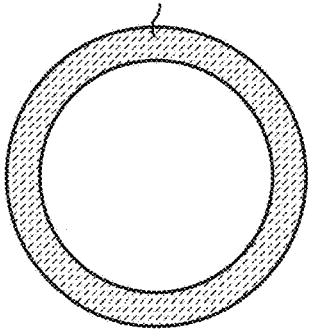
FIG. 2B is a schematic cross-sectional view of a tube utilized to form a diffusion barrier within a composite filament in accordance with various embodiments of the invention.
Figure 2C:
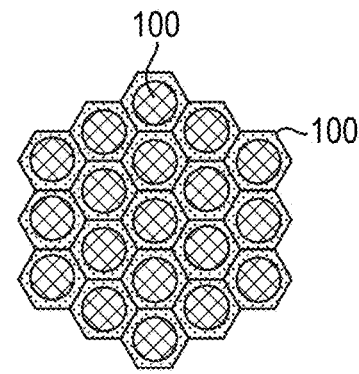
FIG. 2C is a schematic cross-sectional view of a stack of monofilaments utilized to form a composite filament in accordance with various embodiments of the invention.

Once a monofilament 100 is fabricated, other monofilaments 100 may also be fabricated in the same manner, or one or more monofilaments 100 may be divided into multiple pieces. Multiple monofilaments may be stacked together to form at least a portion of a composite filament. FIGS. 2A-2E depict various components and assembly of a composite filament 200. As shown in FIG. 2C, multiple monofilaments 100 may be stacked together in an arrangement that will subsequently become at least a portion of the core of composite filament 200. While FIG. 2C depicts the stacking of 19 different monofilaments 100, embodiments of the invention may include more or fewer monofilaments 100. The stacked assembly of monofilaments 100 may be disposed within a tube 205 that includes, consists essentially of, or consists of Cu or a Cu alloy (e.g., bronze). As shown in FIG. 2B, a tube 210 may be disposed within the tube 205 and around the stack of monofilaments 100; this tube 210 will become the diffusion barrier 215 in the final composite filament and retard or substantially prevent interdiffusion between the monofilaments 100 and the material of tube 205, which becomes the outer matrix 220 of the resulting composite filament. Thus, the tube 210 may include, consist essentially of, or consist of a Ta alloy such as Ta—W (e.g., Ta-3W). Before and/or after the monofilaments 100 are disposed within the tube 205 and the tube 210, the monofilaments 100, the tube 205, and/or the tube 210 may be cleaned and/or etched (e.g., via a cleaning agent including, consisting essentially of, or consisting of one or more acids) to, for example, remove surface oxides and/or other contaminants.

The tube 210 may be fabricated via alloying of pure Ta with the one or more alloying elements disposed within the diffusion barrier. For example, for diffusion barriers (and thus tubes 210) including, consisting essentially of, or consisting of an alloy of Ta and W, Ta and W may be alloyed together in the desired amounts via a process such as electron-beam melting and/or arc melting. The resulting material may be fabricated into a sheet, and the sheet may be formed into a tube by, e.g., rolling, deep drawing, extrusion, pilgering, etc.

Figure 2D:
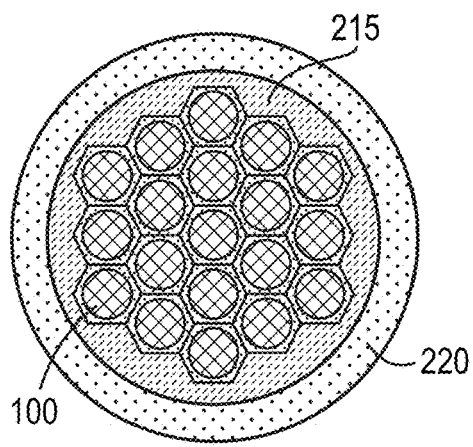
FIG. 2D is a schematic cross-sectional view of a composite filament at an initial stage of fabrication in accordance with various embodiments of the invention.

As shown in FIG. 2D, the tube 205 and tube 210 may be compacted onto the monofilaments 100 by, e.g., swaging, extruding, and/or rolling. The clad stacked monofilaments 100 may be annealed to promote bonding between the various monofilaments 100 in the stacked assembly. For example, the clad stacked monofilaments may be annealed at a temperature between approximately 300° C. and approximately 500° C. (e.g., approximately 400° C.) for a time of approximately 0.5 hour and approximately 3 hours (e.g., approximately 1 hour). Advantageously, the presence of the diffusion barrier 215 between the monofilaments 100 and the outer matrix 220 substantially prevents diffusion between the Cu of the matrix 220 and the monofilaments 100, thereby preventing the formation of metallic phases having low electrical conductivity (e.g., electrical conductivity lower than Cu and/or than the material of matrix 220). The diffusion barrier 215 also provides additional mechanical strength to the final wire, given its superior mechanical properties (e.g., strength, yield strength, tensile strength, stiffness, Young's modulus, etc.) compared with those of the outer matrix 220 and/or the monofilaments 100, particularly after the extended high-temperature heat treatments utilized for reactive formation of the superconducting phase in the wire.

Figure 2E:
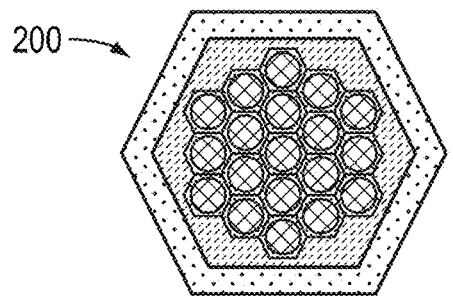
FIG. 2E is a schematic cross-sectional view of a composite filament utilized to form superconducting wires in accordance with various embodiments of the invention.
Figure 5:
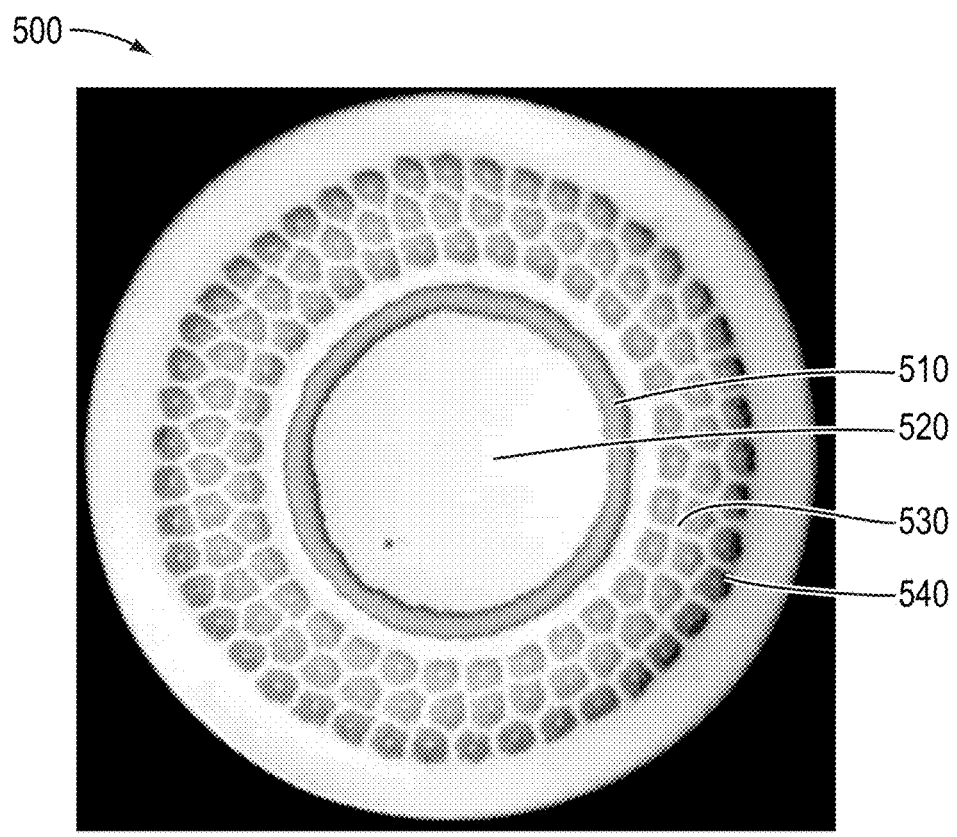
FIG. 5 is a cross-sectional micrograph of a superconducting wire featuring a Cu inner stabilizer and a diffusion barrier disposed around the stabilizer in accordance with various embodiments of the invention.
Figure 6:
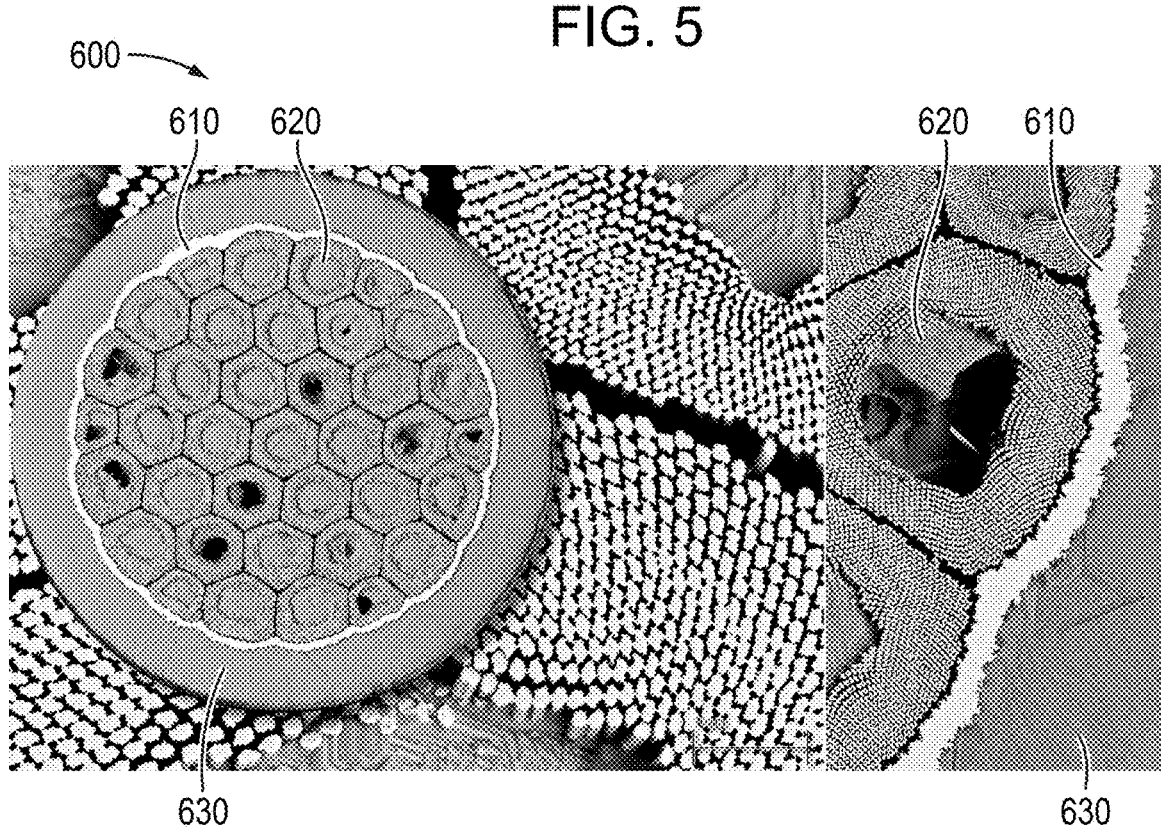
FIG. 6 is a cross-sectional micrograph of a superconducting wire featuring a Cu outer matrix and a diffusion barrier disposed between the outer matrix and the wire filaments in accordance with various embodiments of the invention.

The resulting assembly may be drawn down one or more times to reduce its diameter, and may subsequently be drawn through a shaped die in order to provide composite filament 200 with a cross-sectional shape configured for efficient stacking. For example, as shown in FIG. 2E, a hexagonal die may be utilized to form a composite filament 200 having a hexagonal cross-section. In other embodiments, composite filaments 200 may have other cross-sections, e.g., square, rectangular, triangular, round, off-round, elliptical, etc. In various embodiments, the cross-sectional size and/or shape of the composite filament 200 after processing and shaping is equal to the cross-sectional size and/or shape of the monofilament 100 utilized in the initial stacked assembly before being reduced in size (i.e., shown in FIG. 2C). (Although the diffusion barrier 215 resulting from the incorporation of tube 210 is depicted in FIGS. 2D and 2E as having a variable cross-sectional thickness, in various embodiments of the invention the diffusion barrier 215 has a substantially uniform cross-sectional thickness around its circumference, and diffusion barrier 215 may have the form, in cross-section, of an annular ring (for example, a ring disposed tightly around the filaments (or other structures) therewithin), as shown in FIGS. 5 and 6; diffusion barriers having an annular cross-section in accordance with embodiments of the invention generally have the form of tubes that extend along the axial dimension of the wire.)

Figure 3A:
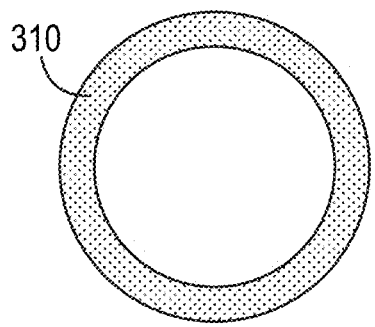
FIG. 3A is a schematic cross-sectional view of a tube utilized to form a stabilizing element in accordance with various embodiments of the invention.
Figure 3B:
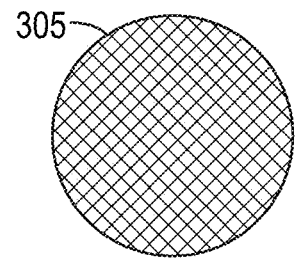
FIG. 3B is a schematic cross-sectional view of a rod utilized to form a stabilizing element in accordance with various embodiments of the invention.
Figure 3C:
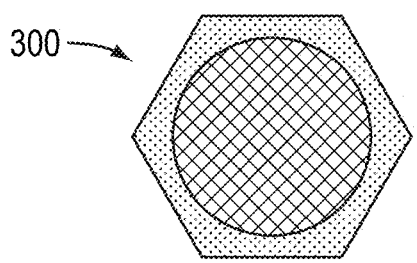
FIG. 3C is a schematic cross-sectional view of a stabilizing element utilized to form stabilized composite filaments and/or superconducting wires in accordance with various embodiments of the invention.

Superconducting wires in accordance with embodiments of the invention may also incorporate stabilizing elements that provide even more mechanical strength while not compromising the drawability and/or electrical performance of the wires. FIGS. 3A-3C depict the fabrication of a stabilizing element 300 via a method similar to that detailed above for monofilaments 100. In accordance with embodiments of the invention, a rod 305 is disposed within a tube 310 that includes, consists essentially of, or consists of Cu or a Cu alloy. The rod 305 may include, consist essentially of, or consist of one or more metals having mechanical strength (e.g., tensile strength, yield strength, etc.) greater than that of rods 105 utilized to fabricate monofilaments 100. For example, the rod 305 may include, consist essentially of, or consist of Ta or a Ta alloy (e.g., a Ta—W alloy such as Ta-3W) or any other material disclosed herein as suitable for diffusion barriers. In other embodiments, the rod 305 may include, consist essentially of, or consist of a Nb alloy having greater mechanical strength than substantially pure Nb. For example, rods 305 (and therefore stabilizing elements) in accordance with embodiments of the invention may include, consist essentially of, or consist of an alloy of Nb with one or more of Hf, Ti, Zr, Ta, V, Y, Mo, or W. For example, stabilizing elements in accordance with embodiments of the invention may include, consist essentially of, or consist of Nb C103 alloy, which includes approximately 10% Hf, approximately 0.7%-1.3% Ti, approximately 0.7% Zr, approximately 0.5% Ta, approximately 0.5% W, and the balance Nb. In other embodiments, stabilizing elements may include, consist essentially of, or consist of a Nb B66 alloy and/or a Nb B77 alloy.

The rod 305 clad with the tube 310 may subsequently be drawn down to reduce its diameter to, for example, between 0.5 inch and 1.5 inches. The clad rod may be drawn down in multiple stages and may be heat treated during and/or after any or each of the drawing steps for, e.g., strain relief. Once drawn down, the clad rod may be drawn through a shaped die in order to fabricate the stabilizing element 300 shaped for efficient stacking with monofilaments 100 and/or composite filaments 200. For example, as shown in FIG. 3C, a hexagonal die may be utilized to form a stabilizing element 300 having a hexagonal cross-section. In other embodiments, stabilizing elements 300 may have other cross-sections, e.g., square, rectangular, triangular, etc. In various embodiments, stabilizing elements 300 may have cross-sectional sizes and/or shapes substantially the same as cross-sectional sizes and/or shapes of monofilaments 100 and/or composite filaments 200.

Figure 3D:
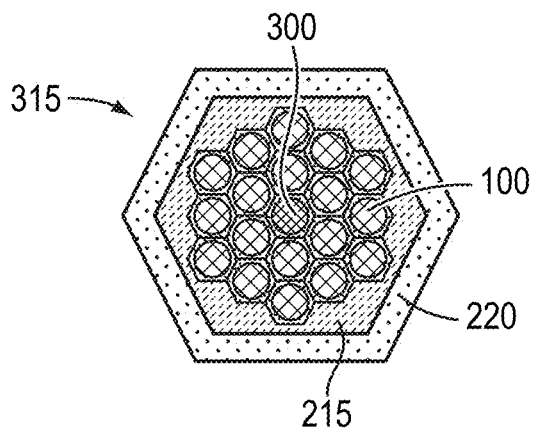
FIG. 3D is a schematic cross-sectional view of a composite filament incorporating a stabilizing element in accordance with various embodiments of the invention.

Once fabricated, one or more stabilizing elements 300 may be inserted into a stack of monofilaments 100, and the resulting assembly may be surrounded with a diffusion-barrier material and a matrix material, drawn down, and optionally shaped to form a stabilized composite filament 315 (e.g., as described above with reference to FIGS. 2A-2E) that incorporates a diffusion barrier 215 between the monofilaments 100 and stabilizing element(s) 300 and the outer matrix 220, as shown in FIG. 3D. In various embodiments of the invention, composite filament may include a diffusion barrier between the stabilizing element 300 and the remaining monofilaments 100 in order to retard or substantially prevent interdiffusion therebetween. In various embodiments, the stabilizing element 300 may be replaced or supplemented with an internal stabilizing matrix that includes, consists essentially of, or consists of, e.g., Cu or a Cu alloy, and such regions may be separated from monofilaments 100 via one or more diffusion barriers.

In embodiments of the invention incorporating stabilizing elements as well as diffusion barriers, the amount of cross-sectional area of the wire imparting additional mechanical strength may be beneficially divided between the diffusion barrier(s) and the stabilizing element(s). That is, the more cross-sectional area of the wire occupied by one or more stabilizing elements, the less cross-sectional area of the wire need be occupied by the diffusion barrier(s), as long as each diffusion barrier has sufficient thickness to retard or substantially eliminate diffusion between the various portions of the wire. Conversely, the use of diffusion barriers in accordance with embodiments of the invention enables the use of one or more stabilizing elements that themselves collectively occupy less of the cross-sectional area of the wire while still imparting the desired mechanical strength (and/or other mechanical properties) to the wire. In various embodiments, the diffusion barrier(s) may collectively occupy at least 2%, at least 3%, at least 4%, or at least 5% of the cross-sectional area of the wire. In various embodiments, the diffusion barrier(s) may collectively occupy less than 15%, less than 12%, less than 10%, less than 9%, or less than 8% of the cross-sectional area of the wire. In embodiments of the invention featuring stabilizing elements, the stabilizing elements and diffusion barriers may collectively occupy less than 25%, less than 20%, or less than 15% of the cross-sectional area of the wire. Stabilizing elements themselves may occupy less than 15% or less than 10% (e.g., approximately 2% to approximately 8%, or approximately 5% to approximately 15%) of the cross-sectional area of the wire. Stabilizing elements may occupy at least 2%, at least 3%, at least 5%, or at least 8% of the cross-sectional area of the wire.

Figure 4A:
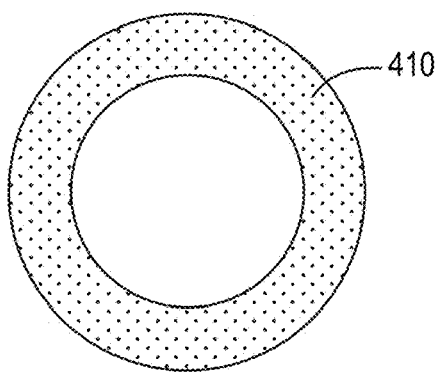
FIG. 4A is a schematic cross-sectional view of a tube utilized to form a superconducting wire in accordance with various embodiments of the invention.
Figure 4B:
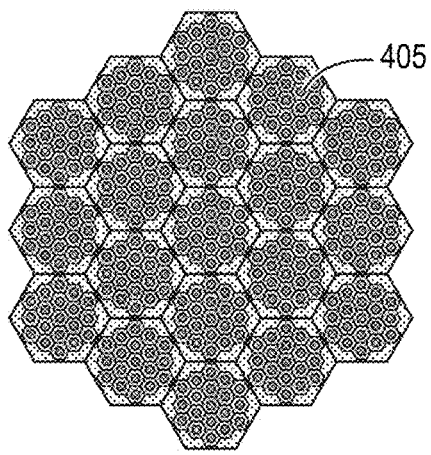
FIG. 4B is a schematic cross-sectional view of a stack of composite filaments utilized to form a superconducting wire in accordance with various embodiments of the invention.

In addition to or instead of being incorporated within one or more composite filaments 200, 315, diffusion barriers in accordance with embodiments of the present invention may be disposed between an outer stabilizing matrix (and/or an inner stabilizing matrix and/or stabilizer proximate the center of the wire) and the composite filaments to advantageously retard or substantially prevent interdiffusion within the superconducting wire. That is, superconducting wires and/or wire preforms may be fabricated utilizing diffusion barriers disposed around assemblies of composite filaments 200, stabilized composite filaments 315, and/or composite filaments lacking their own diffusion barriers. FIGS. 4A-4E depict various stages of the fabrication of an exemplary superconducting wire 400. As shown in FIG. 4B, multiple composite filaments 405 each lacking their own internal diffusion barriers may be stacked together in an arrangement that will subsequently become at least a portion of the core of superconducting wire 400. Each composite filament 405 may be fabricated, for example, similarly to composite filament 200 detailed above but without incorporation of the diffusion barrier 215 arising from the use of tube 210 during fabrication. In other embodiments, the stack of composite filaments may include or be composed of composite filaments 200, composite filaments 315, and/or mixtures thereof with or without composite filaments 405. While FIG. 4B depicts the stacking of 18 different composite filaments 405, embodiments of the invention may include more or fewer composite filaments.

Figure 4D:
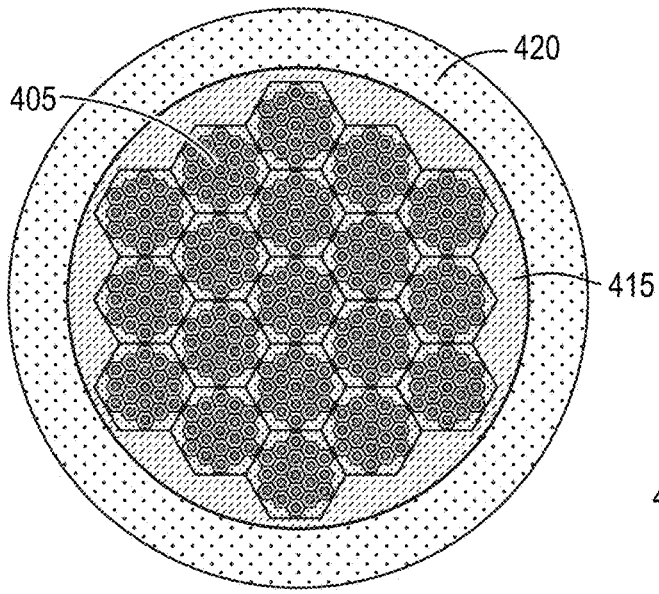
FIG. 4D is a schematic cross-sectional view of a superconducting wire at an initial stage of fabrication in accordance with various embodiments of the invention.
Figure 4C:
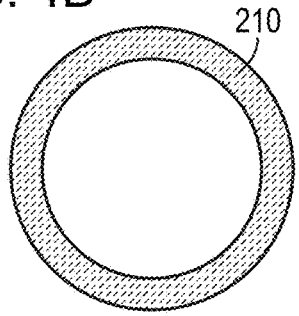
FIG. 4C is a schematic cross-sectional view of a tube utilized to form a diffusion barrier within a superconducting wire in accordance with various embodiments of the invention.

The stacked assembly of composite filaments may be disposed within a tube 410 that includes, consists essentially of, or consists of Cu or a Cu alloy. In addition, as shown in FIG. 4C, a tube 210 may be disposed around the stacked assembly of composite filaments and within the tube 410 and may therefore form a diffusion barrier in the final wire. Before and/or after the composite filaments are disposed within the tube 510 and the tube 210, the composite filaments, the tube 210, and/or the tube 410 may be cleaned and/or etched (e.g., via a cleaning agent including, consisting essentially of, or consisting of one or more acids) to, for example, remove surface oxides and/or other contaminants. As shown in FIG. 4D, the tube 410 and the tube 210 may be compacted onto the composite filaments by, e.g., swaging, extruding, and/or rolling, and tube 210 may become diffusion barrier 415, and tube 410 may become outer matrix 420. The clad stacked composite filaments may be annealed to promote bonding between the various composite filaments in the stacked assembly. For example, the clad stack may be annealed at a temperature between approximately 300° C. and approximately 500° C. (e.g., approximately 400° C.) for a time of approximately 0.5 hour and approximately 3 hours (e.g., approximately 1 hour). Advantageously, the presence of the diffusion barrier 415 between the composite filaments 405 and the outer matrix 420 substantially prevents diffusion between the Cu of the matrix 420 and the composite filaments 405, thereby preventing the formation of metallic phases having low electrical conductivity (e.g., electrical conductivity lower than Cu and/or than the material of matrix 420). The resulting assembly may be drawn down one or more times to reduce its diameter, as shown in FIG. 4E. Before or after drawing, the superconducting wire 400 may be annealed to, e.g., relax residual stresses and/or promote recrystallization therein.

Figure 4F:
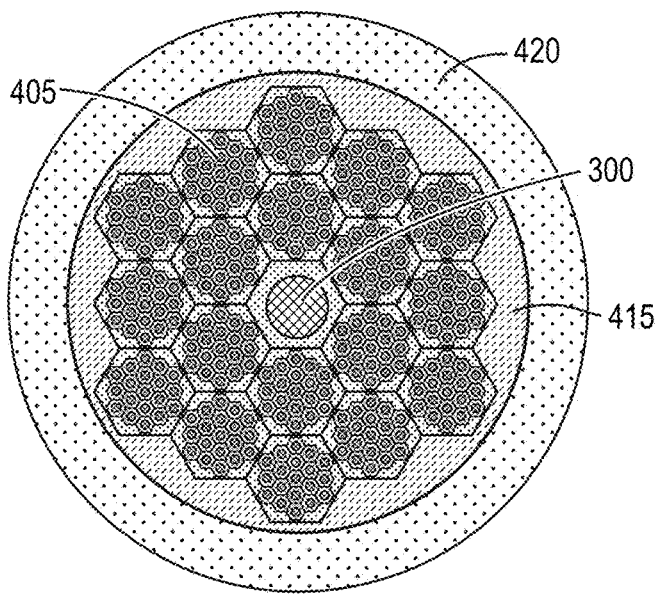
FIG. 4F is a schematic cross-sectional view of a stabilized superconducting wire at an initial stage of fabrication in accordance with various embodiments of the invention.
Figure 4E:
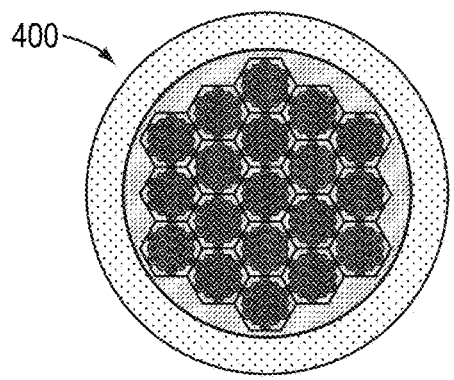
FIG. 4E is a schematic cross-sectional view of a superconducting wire in accordance with various embodiments of the invention.
Figure 4G:
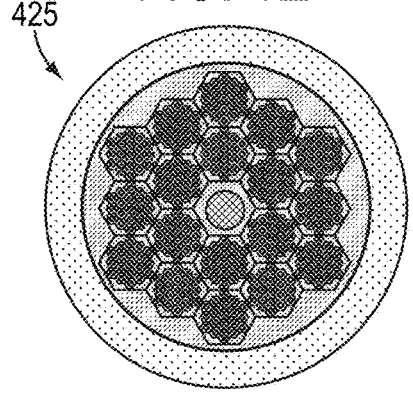
FIG. 4G is a schematic cross-sectional view of a stabilized superconducting wire in accordance with various embodiments of the invention.

As shown in FIGS. 4F and 4G, a similar methodology may be utilized to fabricate stabilized semiconducting wires 425 that incorporate one or more diffusion barriers 415 as well as one or more stabilizing elements 300. For example, the assembly of stacked composite filaments may define therewithin one or more voids each sized and shaped to accommodate one or more stabilizing elements 300. Before or after the composite filaments are disposed within the tube 410 and the tube 210, one or more stabilizing elements 300 may be disposed within each of the voids, as shown in FIG. 4F. The resulting assembly may have its diameter reduced by, e.g., drawing and/or extrusion, as shown in FIG. 4G. In various embodiments, a diffusion barrier may be disposed between stabilizing element(s) 300 and the filaments within the wire or wire preform, particularly in embodiments in which the stabilizing element includes, consists essentially of, or consists of Cu. For example, a tube of the desired diffusion barrier material may be disposed around the stabilizing element when the wire preform assembly is assembled, and the entire assembly may be drawn down to the desired wire dimensions. While FIGS. 4F and 4G depicts the superconducting wire 425 having a single stabilizing element 300 disposed substantially at the center of the stacked assembly of composite filaments, in accordance with embodiments of the invention, one or more stabilizing elements 300 may be disposed at other locations within the stacked assembly in addition to or instead of the stabilizing element 300 disposed at the center.

In various embodiments, the superconducting wire 400, 425 lacks a diffusion barrier 415 therewithin, and thus, tube 210 is not utilized in formation thereof, and diffusion barriers 215 in one or more of the individual composite filaments are utilized to retard or substantially prevent interdiffusion. In other embodiments, as shown in FIG. 4D-4G, the individual composite filaments 405 may lack diffusion barriers therewithin, and diffusion barrier 415 is present within the superconducting wire 400, 425. In such embodiments, the tubes 110 and/or 205 may incorporate therewithin Sn which advantageously reacts with the Nb of the filaments during subsequent thermal processing to form a superconducting phase (e.g., $Nb_3Sn$). In other embodiments, diffusion barrier 415 is present in addition to diffusion barriers 215 within the individual composite filaments.

In various embodiments, the superconducting wire 400, superconducting wire 425, composite filament 4015, composite filament 200, and/or stabilized composite filament 315 may be mechanically processed for diameter reduction and/or to promote bonding between their constituent elements prior to wire drawing steps. For example, the superconducting wire 400, superconducting wire 425, composite filament 4015, composite filament 200, and/or stabilized composite filament 315 may be extruded, swaged, and/or rolled prior to the final drawing step(s). In various embodiments, the superconducting wire 400, superconducting wire 425, composite filament 4015, composite filament 200, and/or stabilized composite filament 315 may be heat treated during and/or after each of multiple different drawing steps for strain relief. For example, during and/or after one or more of the drawing steps, the superconducting wire 400, superconducting wire 425, composite filament 4015, composite filament 200, and/or stabilized composite filament 315 may be annealed at temperatures from approximately 360° C. to approximately 420° C. for a time period of, e.g., approximately 20 hours to approximately 40 hours.

In various embodiments of the present invention, the superconducting wire 400 or superconducting wire 425 may be cooled below the critical temperature of the filaments therewithin and utilized to conduct electrical current. In some embodiments, multiple superconducting wires 400 and/or superconducting wires 425 are coiled together to form a single superconducting cable.

While some superconducting wires 400, 425 (e.g., those incorporating Nb—Ti-containing filaments) may be utilized directly in superconducting applications, the fabrication processes for various other superconducting wires 400, 425 may incorporate one or more steps to incorporate a portion of the superconducting phase. For example, $Nb_3Sn$ superconducting phases, once formed, are typically brittle and may not be further drawn or otherwise mechanically deformed without damage. Thus, embodiments of the present invention may be utilized to fabricate superconducting wires 400, 425 that incorporate Nb and Sn separate from each other; once the wires 400, 425 are mostly or fully fabricated, the wires 400, 425 may be annealed to interdiffuse the Nb and Sn and form the superconducting $Nb_3Sn$ phase therewithin. For example, the drawn wire may be annealed at temperatures from approximately 600° C. to approximately 700° C. for a time period of, e.g., approximately 30 hours to approximately 200 hours. In various embodiments, one or more of the Cu-based tubes 110, 205, or 310 may incorporate Sn therewithin; e.g., one or more of the tubes may include, consist essentially of, or consist of a Cu—Sn alloy (that includes, e.g., 13-15% Sn). Such materials are ductile, enabling the fabrication of the various filaments and wires as detailed herein. Thereafter, the wire 400, 425 may be annealed, resulting in interdiffusion and the formation of the superconducting $Nb_3Sn$ phase at least at the interface between the Nb and the Cu—Sn.

In other embodiments, pure Sn or an Sn alloy (e.g., an Sn alloy with Cu or magnesium (Mg)) may be incorporated (e.g., in the form of a rod or tube) within one or more of the stacks utilized to form composite filaments 200, stabilized composite filaments 315, and/or wires 400, 425; after formation of the composite filaments 200, stabilized composite filaments 315, and/or wires 400, 425 as detailed herein, an annealing step may be performed to form the superconducting $Nb_3Sn$ phase.

FIG. 5 is a cross-sectional view of a superconducting wire 500 incorporating a diffusion barrier in accordance with embodiments of the present invention. As shown, the diffusion barrier 510 is disposed between a Cu stabilizing core 520 of the wire 500 and an outer bronze matrix 530 containing Nb-based filaments 540. FIG. 6 is a cross-sectional view of another superconducting wire 600 incorporating a diffusion barrier in accordance with embodiments of the present invention. As shown, the diffusion barrier 610 is disposed between inner Sb—Cu—Nb-based filaments 620 at the core of the wire 600 and an outer Cu stabilizer 630.

EXAMPLES

A series of experiments were performed to evaluate Ta-3W diffusion barriers in terms of processability and performance (i.e., retarding diffusion within the final wire). The fabrication of the initial Nb-based filaments began by cladding annealed Nb rods with oxygen-free electronic (OFE) Cu tubing by sinking a tube having a slightly larger inner diameter than the diameter of the rod. (As known in the art, OFE Cu is at least 99.99% pure and has an oxygen content no greater than 0.0005%.) The Cu to Nb ratio in each of the monofilaments was approximately 1:3. The clad rods were drawn down to 3.66 mm round and then pulled through a 3.05 mm flat-to-flat hexagonal die. The resulting hexagonal monofilaments were stacked in groups of 19, placed into another Cu tube, and cold drawn to 3.66 mm to form composite filaments, which were subsequently pulled through a 3.05 mm flat-to-flat hexagonal die.

Figure 7A:
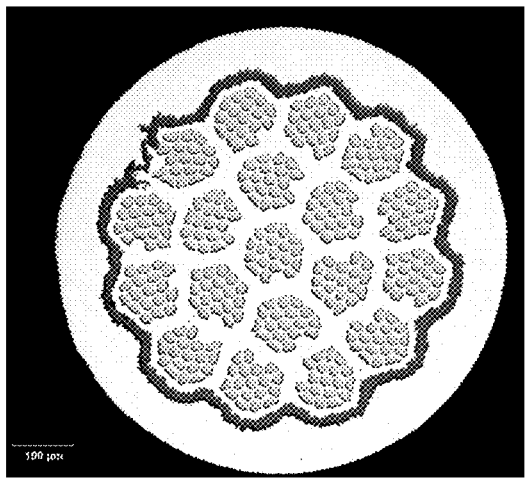
FIG. 7A is a cross-sectional micrograph of a superconducting wire featuring a Cu outer matrix and a Ta-3W diffusion barrier disposed between the outer matrix and the wire composite filaments in accordance with various embodiments of the invention.
Figure 7B:
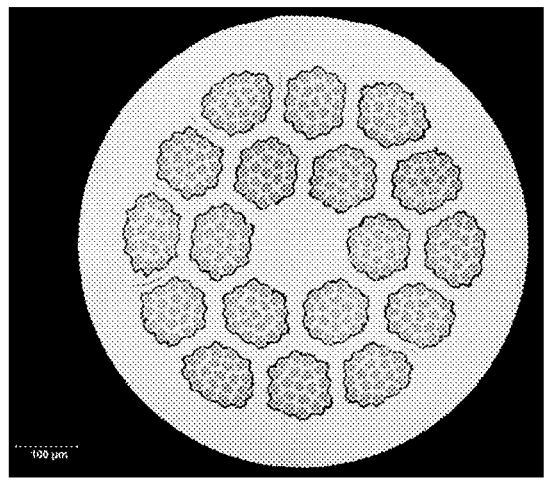
FIG. 7B is a cross-sectional micrograph of a superconducting wire featuring a Cu matrix and a Ta-3W diffusion barrier surrounding each internal composite filament in accordance with various embodiments of the invention.

In order to form a first experimental sample having a single diffusion barrier, 19 of the composite filaments where stacked together and placed within a seam-welded Ta-3W tube having a 12.7 mm diameter and a 0.38 mm wall thickness. This assembly was placed within a Cu stabilizer tube having a 16.5 mm diameter and a 1.5 mm wall thickness. The resulting assembly was cold drawn to 0.72 mm diameter, and a cross-sectional micrograph of the resulting wire 700 is shown in FIG. 7A. Portions of wire 700 were drawn through a 3.05 mm flat-to-flat hexagonal die and stacked together as an 18-element assembly within a Cu tube having an 18.3 mm diameter and a 1.5 mm wall thickness. The resulting assembly was cold drawn down to 0.72 mm diameter, and a cross-sectional micrograph of the resulting wire 710, in which each "bundle" of composite filaments is surrounded by its own diffusion barrier, is shown in FIG. 7B. Wires 700, 710 were fabricated to evaluate the suitability of the Ta-3W diffusion barrier to be co-processed with the Nb and Cu elements of the wire, and thus no Sn elements were incorporated within the wires. As shown in FIGS. 7A and 7B, the diffusion barriers remained continuous and generally conformed to the shape of the filament stacks they surrounded, despite being subjected to an area reduction of over 500:1. Note that the thickness of wire 700 is slightly non-uniform in the location corresponding to the seam weld of the initial Ta-3W tube; such non-uniformities may be addressed via the use of seamless tubes in the original fabrication or by optimizing the weld.

For comparative purposes, two additional wires similar to wire 710 but lacking the diffusion barrier were fabricated.

Figure 7C:
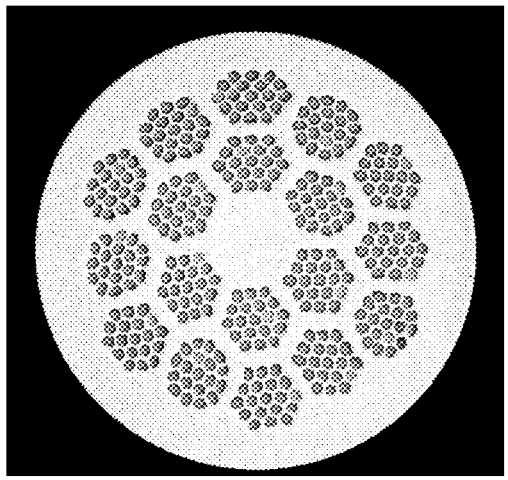
FIG. 7C is a cross-sectional micrograph of a superconducting wire featuring a Cu matrix and composite filaments therein.
Figure 7D:
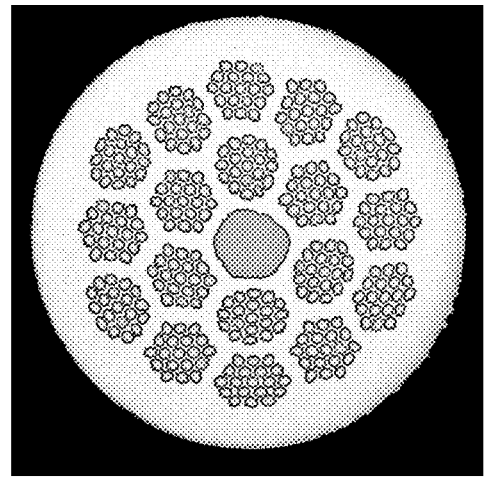
FIG. 7D is a cross-sectional micrograph of a superconducting wire featuring a Cu matrix, composite filaments therein, and a Ta-3W inner stabilizing core in accordance with various embodiments of the invention.

FIG. 7C is a cross-sectional micrograph of a wire 720 having a Cu stabilizer core but lacking the diffusion barrier around each of the 19-element composite filament bundles. FIG. 7D is a cross-sectional micrograph of a wire 730 identical to wire 720 but featuring an inner core stabilizer composed of Ta-3W rather than Cu. The inner core stabilizer of wire 730 occupies approximately 2.5% of the cross-sectional area of wire 730.

Figure 8A:
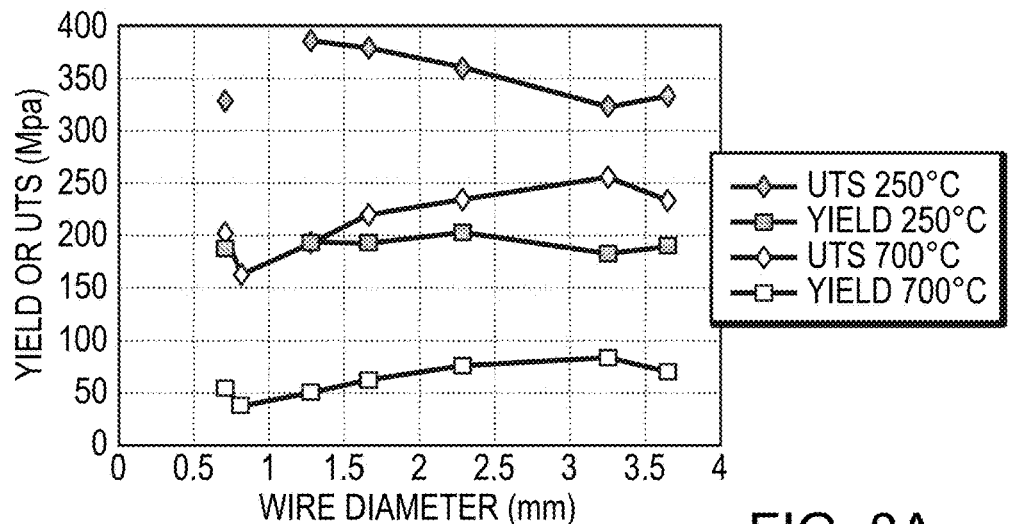
FIG. 8A is a graph of yield strength and ultimate tensile strength of the wire depicted in FIG. 7C after two different annealing treatments.
Figure 8B:
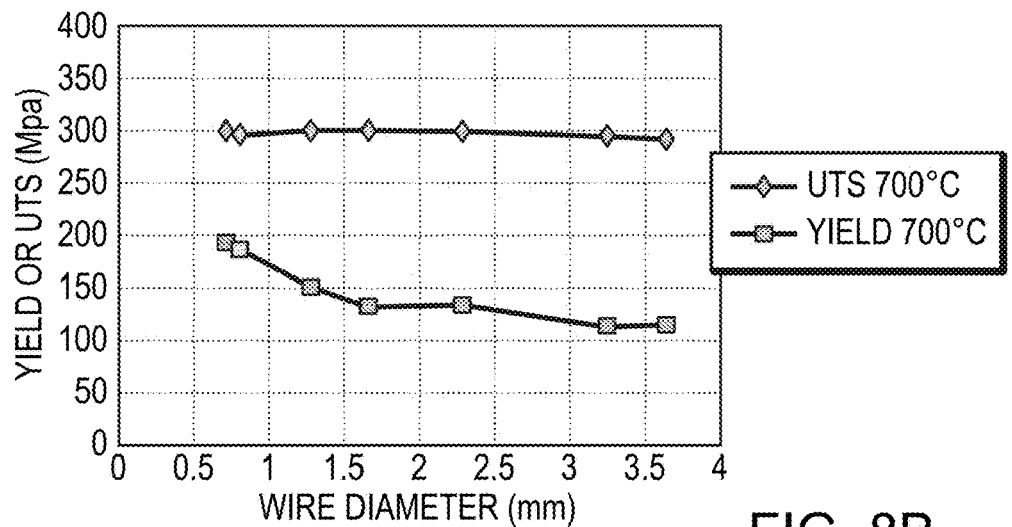
FIG. 8B is a graph of yield strength and ultimate tensile strength of the wire depicted in FIG. 7D after annealing.
Figure 8C:
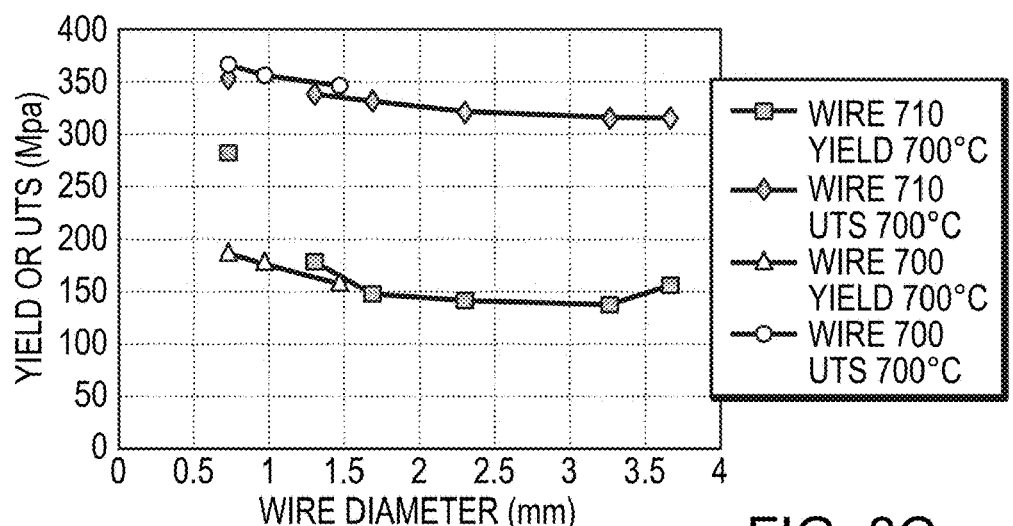
FIG. 8C is a graph of yield strengths and ultimate tensile strengths of the wires depicted in FIGS. 7A and 7B after annealing.

The mechanical properties of portions of the various wires 700, 710, 720, 730 taken at different wire diameters were tested after an anneal designed to mimic an example heat treatment during superconducting wire fabrication. The various wires were annealed at 3 hours for 700° C., and the resulting yield strengths and ultimate tensile strengths of the wires were measured in accordance with ASTM E8/E8M-15a, Standard Test Methods for Tension Testing of Metallic Materials, ASTM International, West Conshohocken, Pa., 2015, the entire disclosure of which is incorporated by reference herein. Additional portions of the wire 720 were annealed at 250° C. for 8 hours for comparative purposes. FIG. 8A is a graph of yield strength ("yield") and ultimate tensile strength ("UTS") for samples of wire 720 annealed at either 250° C. for 8 hours or 700° C. for 3 hours. As shown, the wire 720 softens considerably during the higher-temperature anneal cycle. FIG. 8B is a similar graph of yield strength and UTS for samples of wire 730 annealed at 700° C. for 3 hours. As shown, the wire 730 maintains a higher level of strength after annealing when compared to wire 720 due to the presence of the Ta-3W stabilizing core. FIG. 8C is a similar graph of yield strength and UTS for samples of wires 700 and 710 annealed at 700° C. for 3 hours. As shown, both wires 700 and 710 maintain their strengths at levels even superior to that of wire 730 due to the presence of the Ta-3W diffusion barriers therewithin. It is clear from these results that wires incorporating both Ta-3W diffusion barriers and stabilizers will possess mechanical properties at least comparable to, if not superior to, those of wires 700, 710, and 730. Moreover, such wires would not only possess superior mechanical properties, but would also resist interdiffusion therewithin in a fashion superior to wires possessing only stabilizers. Thus, wires in which the total cross-sectional area devoted to diffusion-barrier and stabilizing-element materials is divided therebetween will possess an advantageous combination of diffusion resistance and mechanical strength while still not compromising the electrical performance of the wire (due to, e.g., an excessively large amount of the wire cross-sectional area being occupied by non-superconducting materials).

Figure 9A:
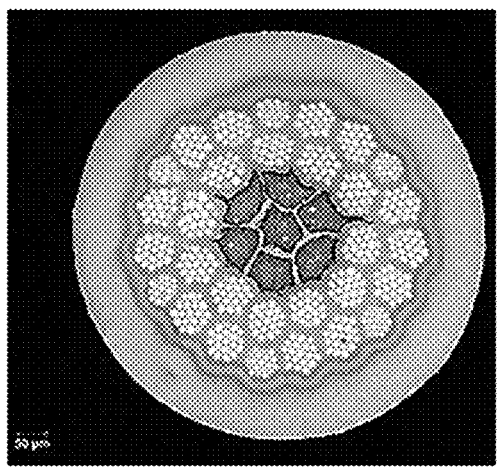
FIG. 9A is a cross-sectional micrograph of a superconducting wire featuring inner Sn-containing filaments, outer Nb-containing composite filaments, and a Ta-3W diffusion barrier surrounding the filaments and separating them from an outer Cu stabilizing matrix.
Figure 9B:
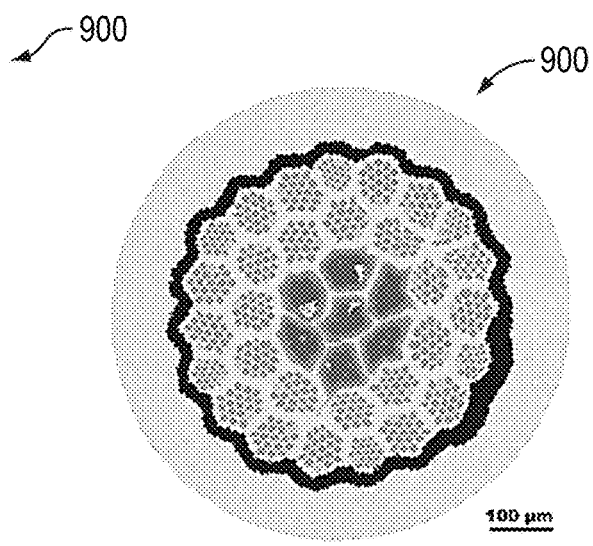
FIG. 9B is a cross-sectional micrograph of the wire depicted in FIG. 9A after annealing at 210° for 72 hours.

An additional experiment was performed to evaluate the efficacy of the Ta-3W diffusion barrier in retarding diffusion within a superconducting wire. The wire 900 featured a 37-element stack surrounded by a Ta-3W diffusion barrier, which was in turn surrounded by an outer Cu wire matrix. The inner 7 elements of the wire were formed from Cu-clad Sn—Ti rods, while the outer 30 elements of the wire were formed from Cu-clad Nb composite filaments. The initial Ta-3W diffusion barrier tube was an overlapped (rather than welded) tube having a diameter of 12.7 mm and a wall thickness of 0.38 mm. FIG. 9A is an optical micrograph of the wire 900 as drawn down to 0.72 mm diameter. The Ta-3W diffusion barrier is intact around the inner elements, and the thickness of the diffusion barrier is slightly thicker in the region of the tube overlap. The diffusion barrier thickness was approximately 0.02 mm, and the Nb filaments have diameters of approximately 0.015 mm. This filament thickness is considerably larger than appropriate for a commercial superconducting wire but was adequate for this demonstration of wire fabrication and diffusion resistance. FIG. 9B is an inverted-contrast scanning electron microscopy (SEM) micrograph of the wire 900 after annealing at 210° C. for a period of 72 hours. This annealing cycle was meant to simply anneal the outer Cu matrix without implicating the diffusion barrier, as at these annealing conditions only short-range solid-state diffusion results.

Figure 9C:
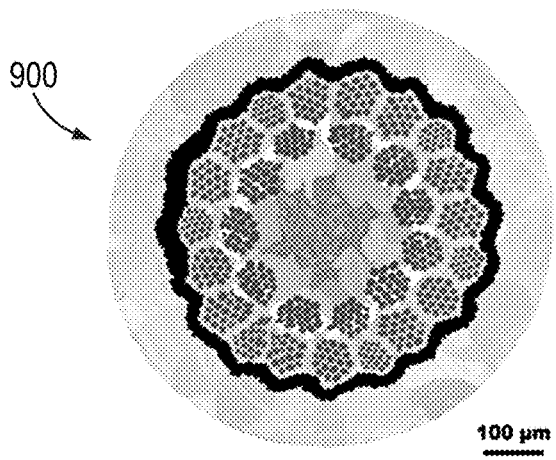
FIG. 9C is a cross-sectional micrograph of the wire depicted in FIG. 9A after annealing at 210° for 72 hours, 400° C. for 48 hours, and 640° C. for 48 hours.
Figure 9D:
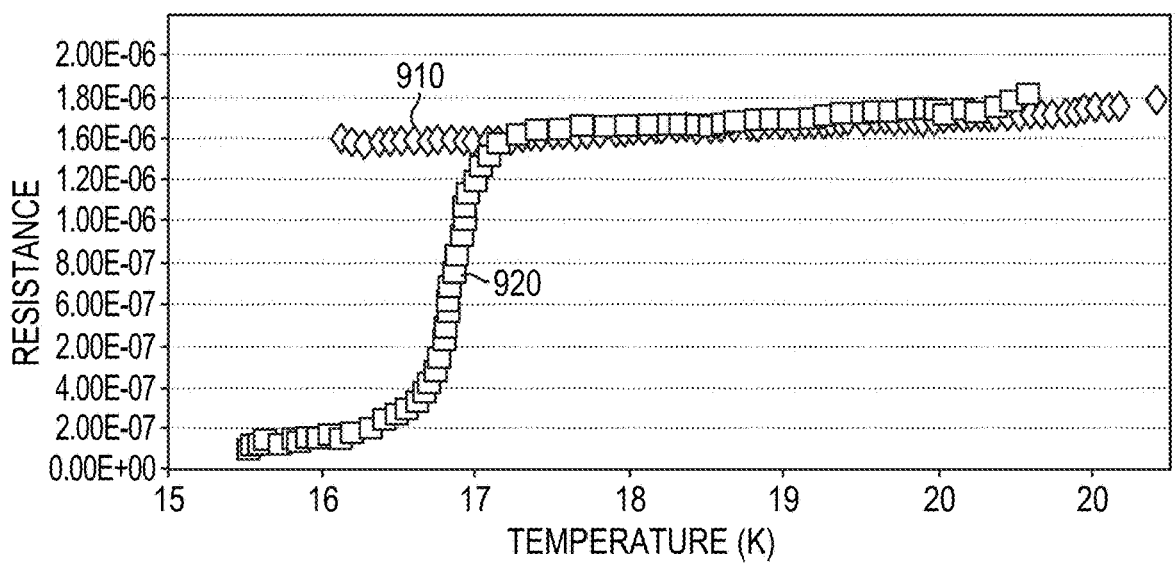
FIG. 9D is a graph of electrical resistance as a function of temperature for the wires depicted in FIGS. 9B and 9C.

FIG. 9C is a micrograph of wire 900 after an annealing cycle representative of the process to fabricate a superconducting wire via an internal diffusion and reaction process. The wire was first annealed at 210° C. for a period of 72 hours (as in FIG. 9B), followed by anneals of 400° C. for 48 hours and 640° C. for 48 hours. As shown, the inner Sn-based filaments have lost definition as the Sn has begun to react with the Nb of the outer Nb-based filaments. In addition, the grain size of the outer Cu matrix has increased after the more aggressive anneal. Despite the more aggressive annealing cycle, the diffusion barrier is intact, and no diffusion into the outer Cu matrix was detected. FIG. 9D is a graph of electrical resistance as a function of temperature for the wire 900 after only the first anneal cycle (line 910) and after the more aggressive annealing sequence (line 920). As shown, after the more aggressive annealing sequence the wire 900 has begun to exhibit a superconducting transition at approximately 17.2 K. The residual resistivity ratio (RRR) of the wire 900 after (1) only the first anneal and (2) after the more aggressive annealing sequence, comparing resistances at 300K and at 19K, was measured using a four-point probe and a current of 0.5 Amperes. The RRR of wire 900 after only the first anneal was 113±3, and the RRR of wire 900 after the more aggressive annealing sequence was 247±7. The superior RRR after the three-anneal sequence is due at least in part to the diffusion resistance of the diffusion barrier preventing contamination of the Cu matrix.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A superconducting wire possessing diffusion resistance and mechanical strength, the superconducting wire comprising:
    an outer wire matrix comprising Cu;
    disposed within the wire matrix, a diffusion barrier comprising a Ta—W alloy containing 0.2%-10% W; and
    a plurality of composite filaments surrounded by the diffusion barrier and separated from the outer wire matrix by the diffusion barrier,
    wherein:
        each composite filament comprises (i) a plurality of Nb-based monofilaments and (ii) a cladding comprising Cu surrounding the plurality of monofilaments,
        the diffusion barrier occupies 2%-15% of a cross-sectional area of the superconducting wire, and
        the diffusion barrier extends through an axial dimension of the superconducting wire.

2. The wire of claim 1, wherein each monofilament comprises a core comprising Nb and, surrounding the core, a cladding comprising Cu.

3. The wire of claim 1, wherein at least one monofilament comprises Nb and at least one of Ti, Zr, Hf, Ta, Y, or La.

4. The wire of claim 1, wherein at least one monofilament comprises Nb and Sn.

5. The wire of claim 1, wherein the diffusion barrier comprises Ta-3W.

6. The wire of claim 1, wherein at least one of the composite filaments has a hexagonal cross-sectional shape and/or at least one of the monofilaments has a hexagonal cross-sectional shape.

7. The wire of claim 1, further comprising a stabilizing element extending through the axial dimension of the superconducting wire, the stabilizing element comprising (i) Ta, (ii) a Ta alloy containing 0.2%-10% W, or (iii) an alloy of Nb and at least one of Hf, Ti, Zr, Ta, V, Y, Mo, or W.

8. The wire of claim 1, wherein a yield strength of the superconducting wire is at least 100 MPa.

9. A superconducting wire possessing diffusion resistance and mechanical strength, the superconducting wire comprising:
   an outer wire matrix comprising Cu;
   disposed within the wire matrix, a diffusion barrier comprising a Ta—W alloy and one or more alloying elements selected from the group consisting of Ru, Pt, Pd, Rh, Os, Ir, Mo, Re, or Si; and
   a plurality of composite filaments surrounded by the diffusion barrier and separated from the outer wire matrix by the diffusion barrier,
   wherein:
      each composite filament comprises (i) a plurality of Nb-based monofilaments and (ii) a cladding comprising Cu surrounding the plurality of monofilaments,
      the diffusion barrier occupies 2%-15% of a cross-sectional area of the superconducting wire, and
      the diffusion barrier extends through an axial dimension of the superconducting wire.

10. The wire of claim 9, wherein the Ta—W alloy contains 0.2%-10% W.

11. The wire of claim 9, wherein the Ta—W alloy is Ta-3W.

12. The wire of claim 9, wherein each monofilament comprises a core comprising Nb and, surrounding the core, a cladding comprising Cu.

13. The wire of claim 9, wherein at least one monofilament comprises Nb and at least one of Ti, Zr, Hf, Ta, Y, or La.

14. The wire of claim 9, wherein at least one monofilament comprises Nb and Sn.

15. The wire of claim 9, further comprising a stabilizing element extending through the axial dimension of the superconducting wire, the stabilizing element comprising (i) Ta, (ii) a Ta alloy containing 0.2%40% W, or (iii) an alloy of Nb and at least one of Hf, Ti, Zr, Ta, V, Y, Mo, or W.

16. A superconducting wire possessing diffusion resistance and mechanical strength, the superconducting wire comprising:
   an inner wire stabilizing matrix comprising Cu;
   disposed around the wire stabilizing matrix, a diffusion barrier comprising a Ta—W alloy containing 0.2%-10% W; and
   a plurality of composite filaments disposed around the diffusion barrier and separated from the wire stabilizing matrix by the diffusion barrier,
   wherein:
      each composite filament comprises (i) a plurality of Nb-based monofilaments and (ii) a cladding comprising Cu surrounding the plurality of monofilaments,
      the diffusion barrier occupies 2%-15% of a cross-sectional area of the superconducting wire, and
      the diffusion barrier extends through an axial dimension of the wire.

17. The wire of claim 16, wherein each monofilament comprises a core comprising Nb and, surrounding the core, a cladding comprising Cu.

18. The wire of claim 16, wherein at least one monofilament comprises Nb and at least one of Ti, Zr, Hf, Ta, Y, or La.

19. The wire of claim 16, wherein at least one monofilament comprises Nb and Sn.

20. The wire of claim 16, wherein the diffusion barrier comprises Ta-3W.

21. The wire of claim 16, wherein the diffusion barrier additionally contains one or more alloying elements selected from the group consisting of Ru, Pt, Pd, Rh, Os, Ir, Mo, Re, or Si.

22. The wire of claim 16, wherein at least one of the composite filaments has a hexagonal cross-sectional shape and/or at least one of the monofilaments has a hexagonal cross-sectional shape.

23. The wire of claim 16, further comprising a stabilizing element extending through the axial dimension of the superconducting wire, the stabilizing element comprising (i) Ta, (ii) a Ta alloy containing 0.2%40% W, or (iii) an alloy of Nb and at least one of Hf, Ti, Zr, Ta, V, Y, Mo, or W.

24. The wire of claim 16, wherein a yield strength of the superconducting wire is at least 100 MPa.

* * * * *